United States Patent [19]

Massie

[11] Patent Number: 5,650,715
[45] Date of Patent: Jul. 22, 1997

[54] METHOD AND APPARATUS FOR SENSING CURRENT IN POWER SUPPLIES

[75] Inventor: Harold L. Massie, W. Linn, Oreg.

[73] Assignee: Intel Corporation, Santa Clara, Calif.

[21] Appl. No.: 633,690

[22] Filed: Apr. 19, 1996

[51] Int. Cl.[6] .................. G05F 1/40; G05F 1/56
[52] U.S. Cl. .............. 323/273; 363/21; 323/358
[58] Field of Search ................. 323/273, 274, 323/277, 358; 363/21

[56] References Cited

U.S. PATENT DOCUMENTS

| | | | |
|---|---|---|---|
| 3,768,012 | 10/1973 | Wilkinson | 323/234 |
| 3,859,586 | 1/1975 | Wadlington | 363/25 |
| 4,149,233 | 4/1979 | Nagano | 363/71 |
| 4,383,293 | 5/1983 | Randall | 363/97 |
| 5,036,452 | 7/1991 | Loftus | 363/71 |
| 5,508,606 | 4/1996 | Ryczek | 324/117 R |

*Primary Examiner*—Stuart N. Hecker
*Attorney, Agent, or Firm*—Blakely, Sokoloff, Taylor & Zafman

[57] ABSTRACT

A circuit for detecting peak current pulses on a secondary transformer of a power supply and converting these peak current pulses into a direct current (DC) voltages, which can be used for various purposes such as current limiting or current sharing. A peak detection circuit is coupled to the secondary transformer and is employed to detect a peak current pulse through the secondary transformer. A sample and hold circuit that is coupled to the peak detection circuit samples the current through a current sense transformer. The sample and hold circuit provides the current pulse through the secondary transformer in a direct current voltage representation. The sample and hold circuit includes a storage circuit for storing this direct current voltage representation of the current through the secondary transformer. The sample and hold circuit selectively samples the current through the current transformer in response to a control signal generated by the peak detection circuit.

18 Claims, 10 Drawing Sheets

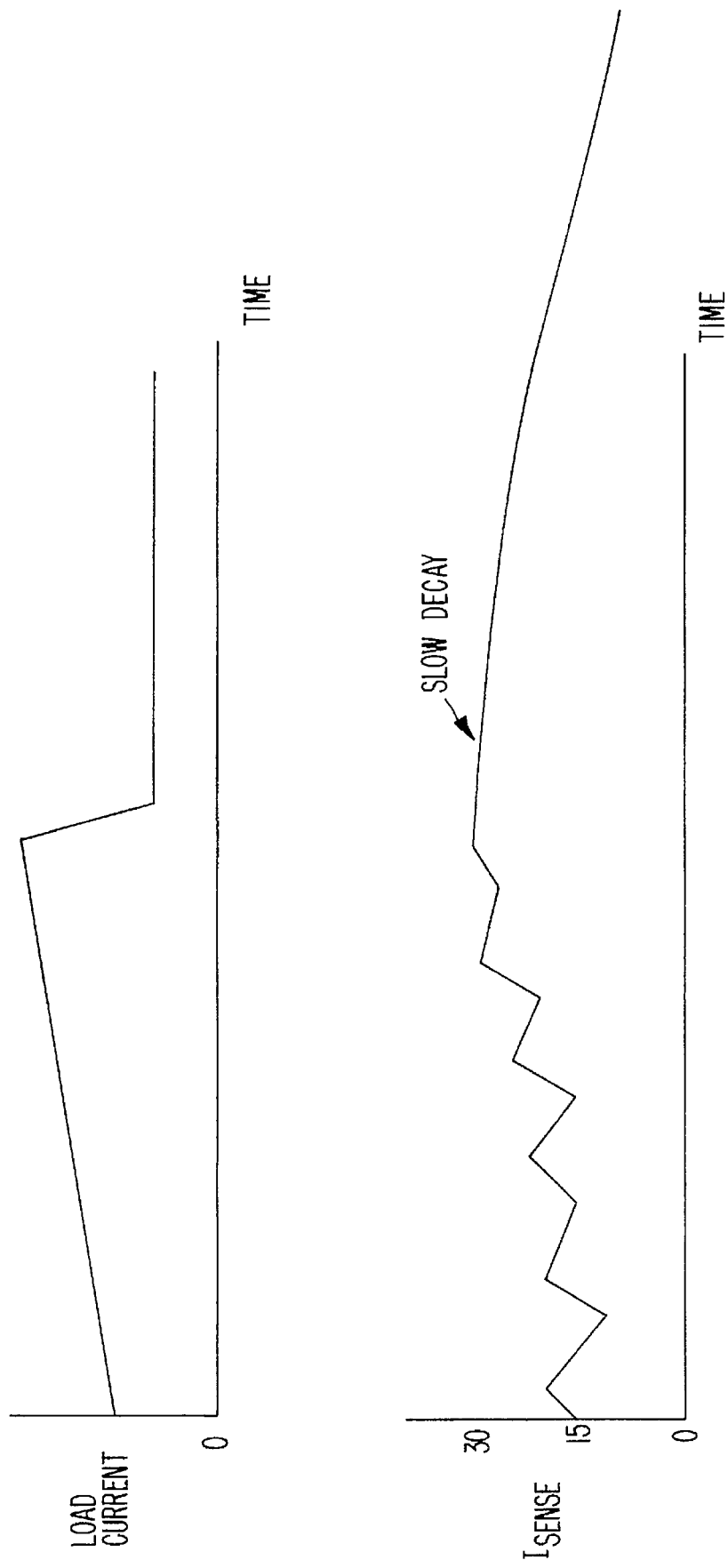

5,650,715

METHOD AND APPARATUS FOR SENSING CURRENT IN POWER SUPPLIES

BACKGROUND OF THE INVENTION (1) Field of the Invention

The present invention relates to power supplies. Specifically the present invention relates to a method and apparatus for sensing current in power supplies.

(2) Prior Art

FIG. 1 illustrates a prior art approach to sensing current in a power supply. This prior art system includes a power supply secondary output block 3 that typically includes a secondary power supply output circuit. A current sense transformer circuit 5 is coupled to the power supply secondary output circuit. Typically, a secondary transformer output filter 9 is coupled to the current sense transformer circuit 5. The output of the secondary transformer output filter 9 is then coupled to a power bus (e.g., 5V power bus). The output of the current sense transformer is a current determined by the transformer's turn ratio.

A rectification and filter circuit 11 is coupled to the current sense transformer circuit 5 for detecting the output of the current sense transformer circuit 5 and converting the current pulses output into a rectified analog waveform. The rectification and filter circuit 11 may be implemented using a diode 31 that is coupled in series with a parallel combination of a resistor 35, and a capacitor 37. Resistor 35 determines the voltage sensed at the current peaks since voltage equals the product of the current and the resistance. The storage capacitor 15 stores energy during the current off time with a time constant of the resistance of resistor 35 times the capacitance of capacitor 37. Because the output of the transformer is a current pulse with a duty cycle set by the power supply of typically thirty percent (30%), the voltage across resistor 35 and capacitor 37 does not reach a peak voltage value of the current times resistor 35. Also, during the off time, resistor 35 will discharge capacitor 37, which results in a ripple voltage. The response to a current step increase is determined by capacitor 37 and the response to a current step decrease is determined by the time constant formed by resistor 35 and capacitor 37. Therefore, this type of detector has limitations in transient response, ripple voltage, and accuracy is affected by the duty cycle of the current pulses, since resistor 35 and capacitor 37 function as an averaging circuit. The duty cycle is affected by the load, as well as, the other outputs. The output of the storage capacitor 37 is coupled to a sense node ($I_{sense}$) 16. Typically, a current share controller 17 may be coupled to the sense node 16.

For a description of a current share controller 17 that may be employed in conjunction with the present invention, please see U.S. Pat. No. 5,428,524, entitled "Method and Apparatus for Current Sharing Upon Multiple Power Supplies" by Harold Massie assigned to the common assignee.

A sense bus isolation circuit 19 is coupled to the sense node 16. The output of the isolation circuit is typically coupled to the $I_{bus}$. The $I_{bus}$ is a signal bus having a voltage which represents the output current of the power supply. In a redundant power supply system (i.e., a system having multiple power supplies supplying the same power supply voltage), the $I_{bus}$ allows the power supplies to adjust their output current to match the largest output current which is represented by the signal on the $I_{bus}$.

An isolation circuit 19 typically includes an operational amplifier 45 having an output port that is coupled to a diode 47. The negative terminal of the diode is coupled to the negative terminal of the operational amplifier 45 to provide negative feedback. The circuit couples a positive $I_{sense}$ signal to the $I_{bus}$ without affecting the sense node 16. As long as the sense node 16 is more positive than the $I_{bus}$, the rectification circuit will apply the sense node voltage to the $I_{bus}$. The $I_{bus}$ is the current share bus and has the $I_{sense}$ voltage corresponding to the power supply with the highest sense node voltage.

This prior art technique has several disadvantages. First, the peak detection and sample and hold circuit that employs a resistor and capacitor (RC), introduces an RC delay into the current sense operation. This RC delay affects the time before an current sense reading is accurately detectable. Second, the prior art circuit for detecting current has no element for preventing and/or minimizing ripples on the sense waveform due to the discharge of the capacitor 37 by the resistor 35.

Accordingly, a method and apparatus for sensing current is desirable that minimizes RC delay, maintains accuracy over changing duty cycle, and minimizes ripples in the current sense waveform.

BRIEF SUMMARY OF THE INVENTION

A method and apparatus for detecting peak current pulses on a secondary of a power supply and converting these peak current pulses into a direct current (DC) voltage representations is disclosed. The present invention includes a peak detector circuit, coupled to the secondary transformer, for detecting peak current pulses through the secondary transformer. A sample and hold circuit is coupled to the peak detector circuit and samples the current through the secondary transformer in response to a control signal generated by the secondary transformer. The sample and hold circuit samples the peak current through the secondary transformer and provides a voltage in response to the control signal generated by the peak detector circuit. Accordingly, the present invention is a simple, low cost current sense circuit for power supplies that provides very fast transient response and a direct current voltage that accurately represents the actual power supply output current with minimal ripple voltage. Accuracy is not affected by the power supply pulse duty cycle.

BRIEF DESCRIPTION OF THE DRAWINGS

The present invention is illustrated by way of example and not limitation in the figures of the accompanying drawings in which like references indicate similar elements.

FIG. 12 illustrates the current sense voltage versus time graph of the prior art current sense circuit of FIG. 1.

DETAILED DESCRIPTION OF THE INVENTION

In the following detailed description of the present invention, numerous specific details are set forth in order to provide a thorough understanding of the present invention. However, it will be obvious to one skilled in the art that the present invention may be practiced without these specific details. In other instances, well known methods, procedures, components, and circuits have not been described in detail in order to not obscure aspects of the present invention.

Figure 1:
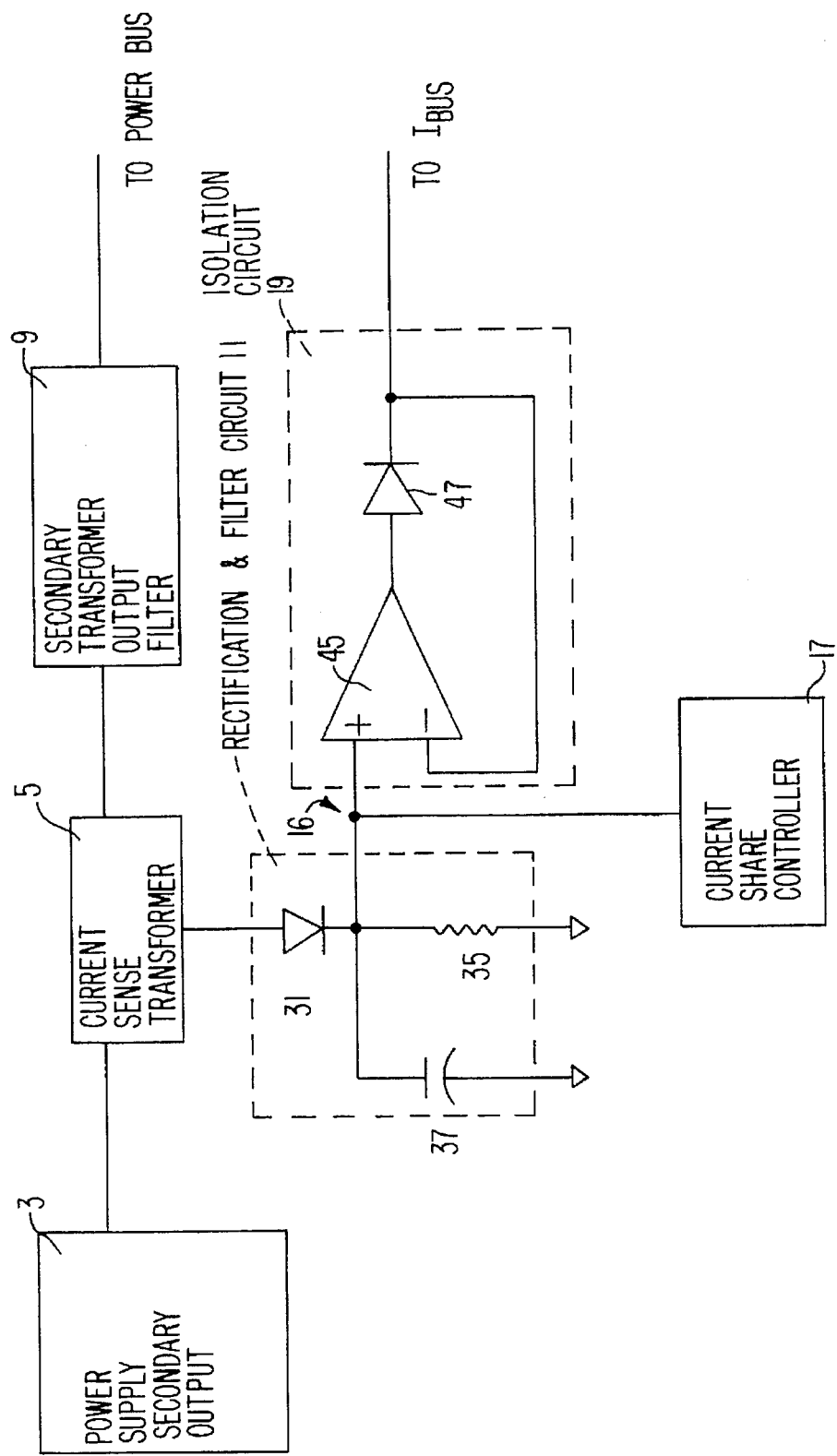
FIG. 1 illustrates a prior art current sense circuit.
Figure 2:
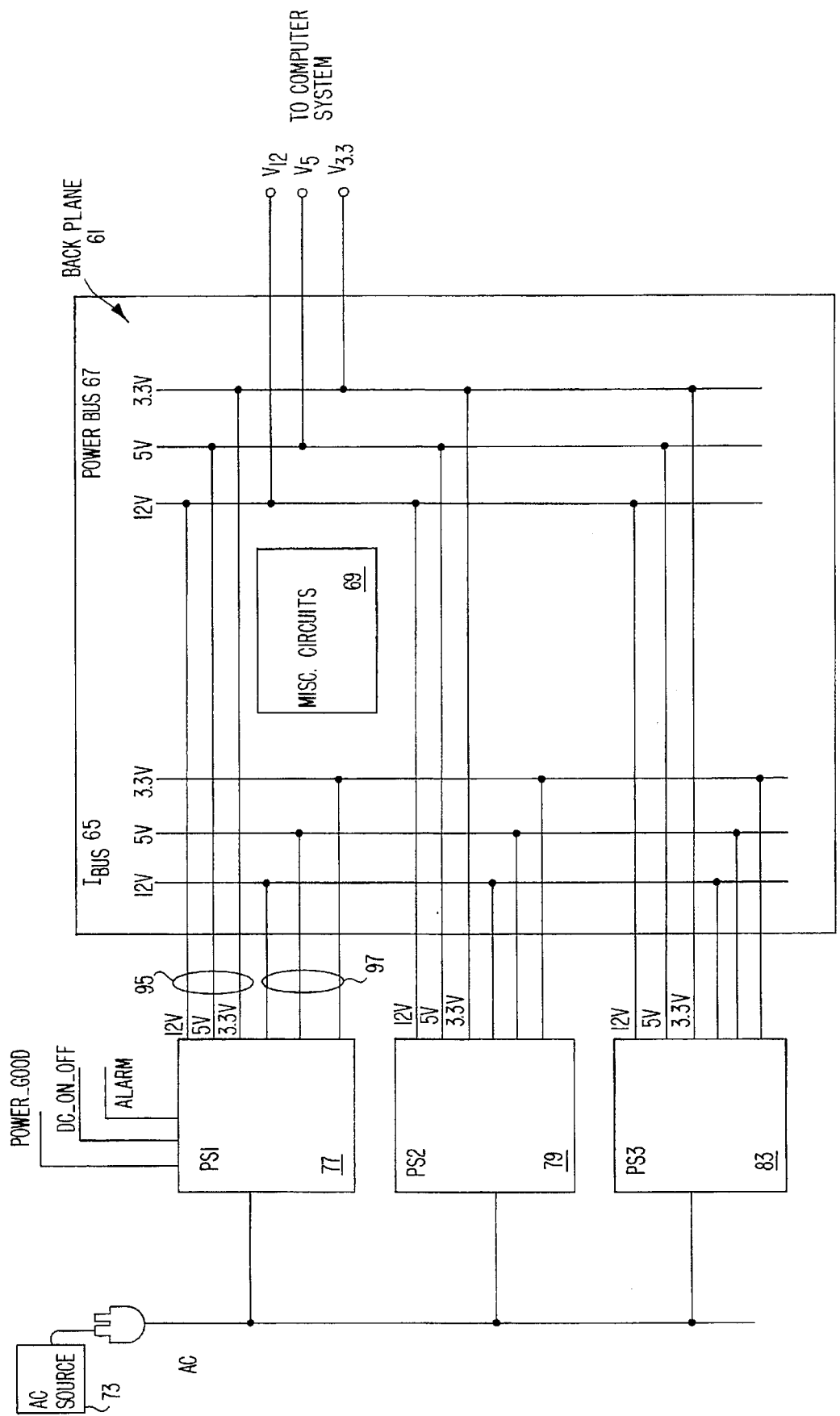
FIG. 2 illustrates a computer system in which the present invention may be implemented.

FIG. 2 illustrates a redundant power supply system in which the present invention may be implemented. A redundant power supply system typically includes a backplane 61 that includes a plurality of current sense busses ($I_{bus}$) 65 and a plurality of power busses 67. The sense busses 65 provide a voltage representing the output current of each power supply to the power supplies of the system and to other components in the system.

The output current of each power supply voltage is provided so that the other components may use this current information to regulate and control the power supplies. As noted in FIG. 2, there is typically one sense bus for each power supply voltage. The power busses 67 simply provide the power supply voltages needed by a computer system.

Since this is a redundant power supply system, there are a plurality of power supplies (e.g., 77, 79, 83). Each of these power supplies provide the required voltages power supply transformer secondary output circuit (e.g., 12 volts, 5 volts, 3.3 volts) to the power busses 67 and provide the respective current sense power supply transformer secondary output circuit for each of those power supply voltages to the sense busses 65.

Each power supply has an input for receiving an AC power supply from an AC power source 73. Each of the power supplies may also have a plurality of miscellaneous inputs and outputs (e.g., power_good, DC_On_Off, alarm). Moreover, the power supplies typically provide a number of signals (not shown) to the system. These signals indicate to other circuits, disposed on the backplane 61, that a particular power supply has failed, is okay, or is providing good regulation. The backplane 61 also includes miscellaneous circuits 69, such as interface and control circuits that interface between the power supplies and the computer system.

The present invention may be implemented in any of the power supplies (77, 79, 83) and implemented in any number of these power supplies. The details of a power supply will be described hereinafter in FIG. 3.

Figure 3:
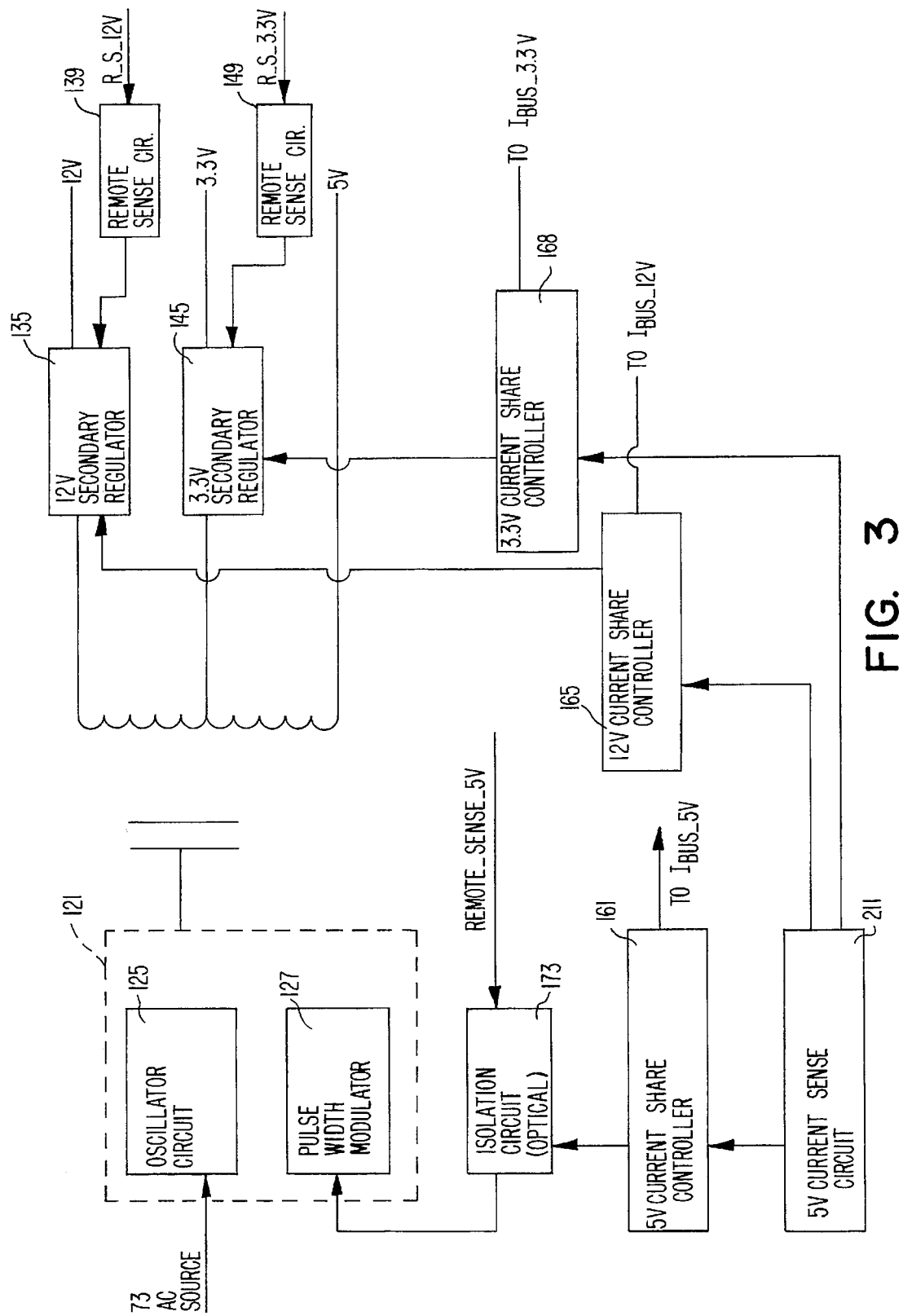
FIG. 3 illustrates how the present invention may be used for current sharing and current limiting.

FIG. 3 illustrates in greater detail a power supply 121 in which the present invention may be implemented. Typically, a power supply 121 includes an oscillator circuit 125 for generating a frequency at which to switch the power supply. Moreover, a power supply 121 includes a pulse width modulator (PWM) circuit 127 that controls the switching of the power supply. On the secondary side, a series of secondary regulator circuits (e.g., mag amp, line regulators, DC to DC converter), one for each voltage (e.g., 135, 145) provide the power supply voltages to the power busses. A remote sense circuit (139,149) is coupled to several of the power supply voltages. This remote sense circuit 139 controls the output of the secondary regulator circuit in response to a remote sense signal from the current sense busses.

Generally, the secondary regulator circuit and remote sense circuit combination is used for voltage such as 12 volts and 3.3 volts since the secondary regulator circuit is very efficient. This secondary regulator circuit may be any one of several regulator circuits, such as a magnetic amplifier (mag. amp.), linear, or other circuit.

For the primary voltage (e.g., 5 volts), there is no secondary regulator circuit and the remote sense signal is provided to an optical isolation circuit 173. The optical isolation circuit 173, in response to the remote sense signal for 5 volts, generates a control signal to the PWM 127. The optical isolation circuit 173 is further coupled to a current share controller 161. The current share controller (e.g., 161) provides a control signal that increases the voltage of the power supply as required to current share. This control signal is provided to the optical isolation circuit 173. Similarly, a current share controller (165, 168) is coupled to each of the secondary regulator circuit for providing a control signal to increase the voltage of that particular power supply.

The current share controller (161, 165, 168) may be implemented by an off-the-shelf the parts or by an apparatus described in the above-referenced patent to the common assignee.

A current sense circuit 211 is coupled to current share controllers 161, 165, 168, as shown. The current sense circuit 211 (also herein referred to as peak detection sample and hold circuit) includes additional inputs (not shown). These inputs, and, the operation of the current sense circuit 211 are described in greater detail hereinafter in connection with FIGS. 5 and 6.

Figure 4:
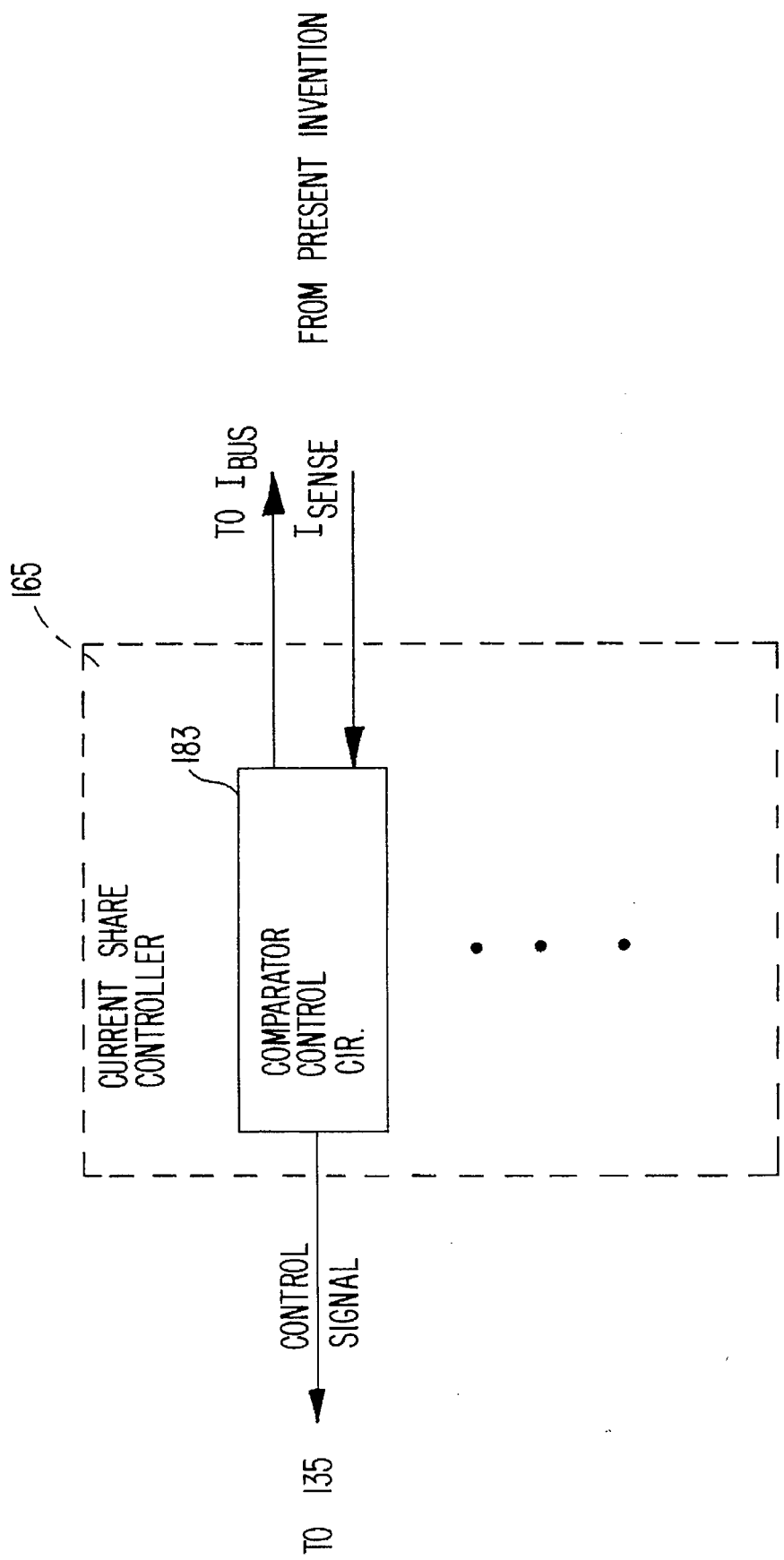
FIG. 4 illustrates in greater detail a current share controller of FIG. 1.

FIG. 4 illustrates in greater detail the current share controller 161. The current share controller 161 includes a plurality of comparator control circuits 183. Each comparator control circuit includes a first input for receiving an internal current sense ($I_{sense}$) voltage that may be provided by the present invention. The comparator control circuit includes an output for controlling the output voltage of the power supply and a second input from the $I_{bus}$ voltage. The comparator control circuit 183, in response to the difference of the two inputs (i.e., $I_{bus}$, internal sense), generates a control signal to the mag amp or optical isolation buffer. For example, if a decrease in the internal current is detected with regard to $I_{bus}$, then the comparator control circuit 183 increases the power supply voltage of that power supply.

Figure 5:
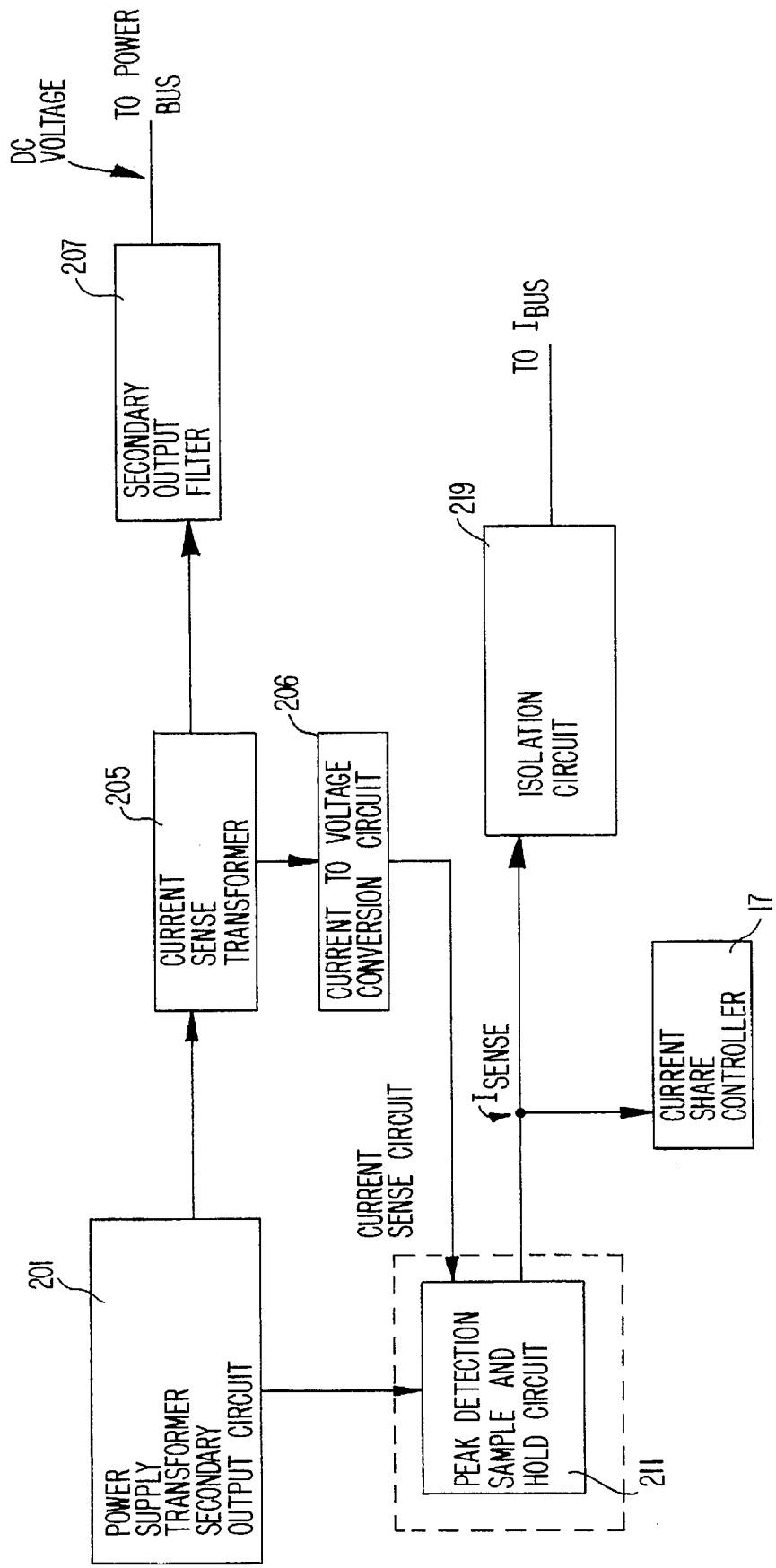
FIG. 5 illustrates a block diagram of one embodiment of the present invention.

FIG. 5 illustrates a block diagram of one embodiment of the present invention. The present invention includes a power supply transformer secondary output circuit 201. For example, this power supply transformer secondary output circuit 201 may be implemented using a full wave, forward converter, or other configuration. It will be noted by those skilled in the art that the power supply transformer secondary output circuit 201 may be implemented using a number of different configurations. A current sense transformer 205 is coupled to the power supply transformer secondary output circuit 201. A secondary output filter 207 is coupled to the current sense transformer 205. The secondary output filter transforms the voltage pulse into a DC voltage. The secondary output filter 207 includes an output for providing a power supply voltage to a power bus.

The current sense transformer 205 simply detects a current from the power supply transformer secondary output circuit 201. The secondary output filter circuit 207 has an input port for receiving a current from the power supply transformer secondary output circuit 201. Moreover, the peak detection sample and hold circuit 211 is coupled to the current to voltage conversion circuit 206. The peak detection sample and hold circuit 211 includes a sample and hold unit and an enable signal generator, hereinafter described. The output of the peak detection sample and hold circuit 211 is coupled to a current share controller 17, described previously and an isolation circuit 219, which rectifies the signal at the $I_{sense}$ node into a current sense voltage for the sense busses ($I_{bus}$).

It will be noted by those skilled in the art that the embodiment, illustrated in FIG. 5, may be duplicated for each power supply in a multiple power supply system.

Figure 6:
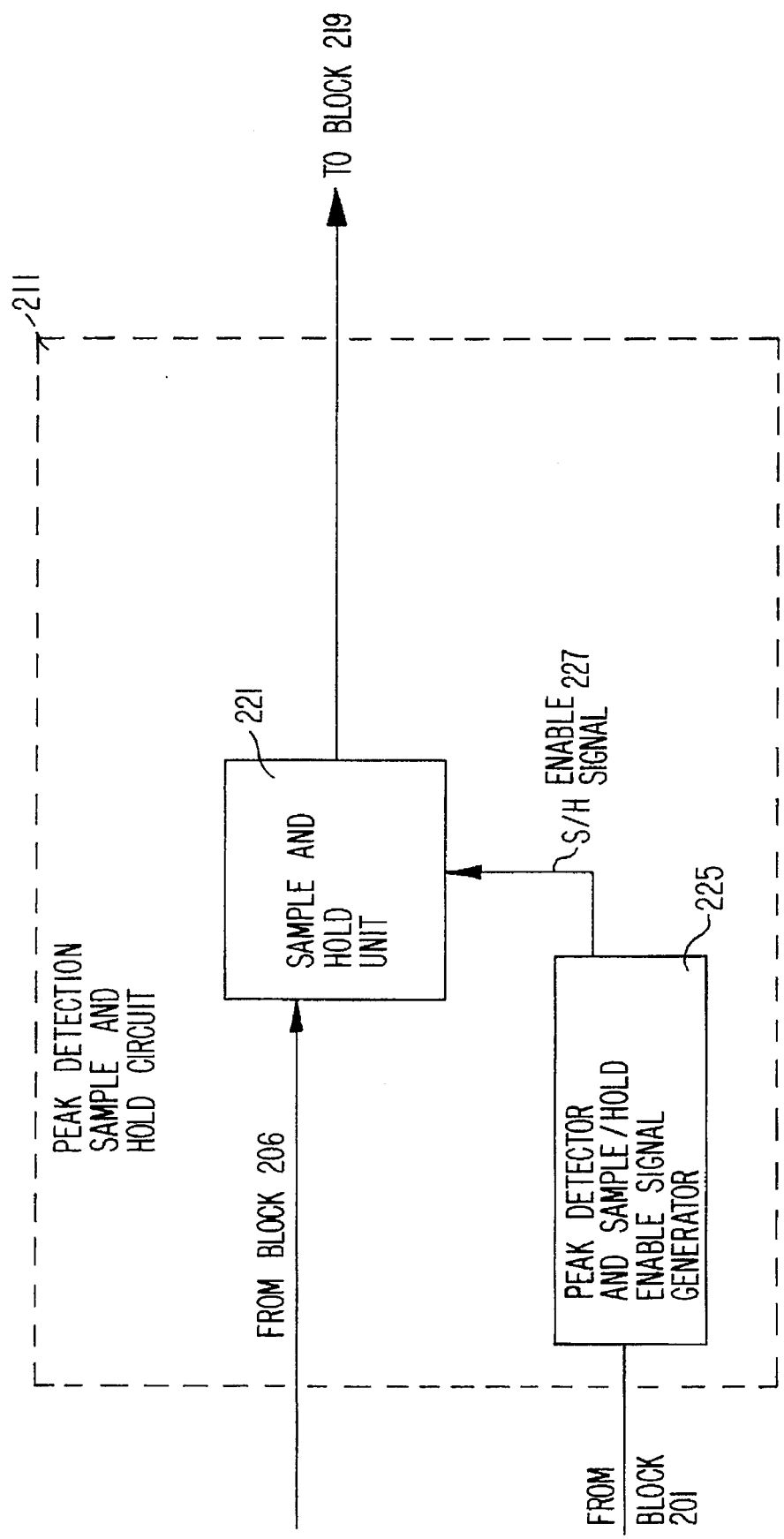
FIG. 6 illustrates a block diagram illustrating in greater detail the peak detection circuit and the conversion circuit of FIG. 5.

FIG. 6 illustrates in greater detail the peak detection sample and hold circuit 211 of one embodiment of the present invention. The peak detection sample and hold circuit 211 of the present invention includes a sample and hold unit 221 for receiving a voltage sensed from the power supply transformer secondary output circuit 201 and converting it into a current sense voltage ($I_{sense}$). The sample and hold unit 221 may be implemented with a transistor, a capacitor, and resistors in one embodiment, as will be described hereinafter. The peak detection sample and hold circuit 211 also includes a sample and hold enable signal generator 225 for generating an enable signal 227 that enables a sample and hold unit 211 to convert the voltage sensed form the output of the conversion circuit 206 into the signal at the $I_{sense}$ node. The hold enable signal generator 225 includes a first input for receiving a voltage from the power supply transformer secondary output circuit 201. The hold enable signal generator 225 shapes the voltage received from the secondary transformer into an enable signal 227. This circuit 225 basically provides a slow turn-on and a fast turn-off of the sample and hold unit 221.

Figure 7:
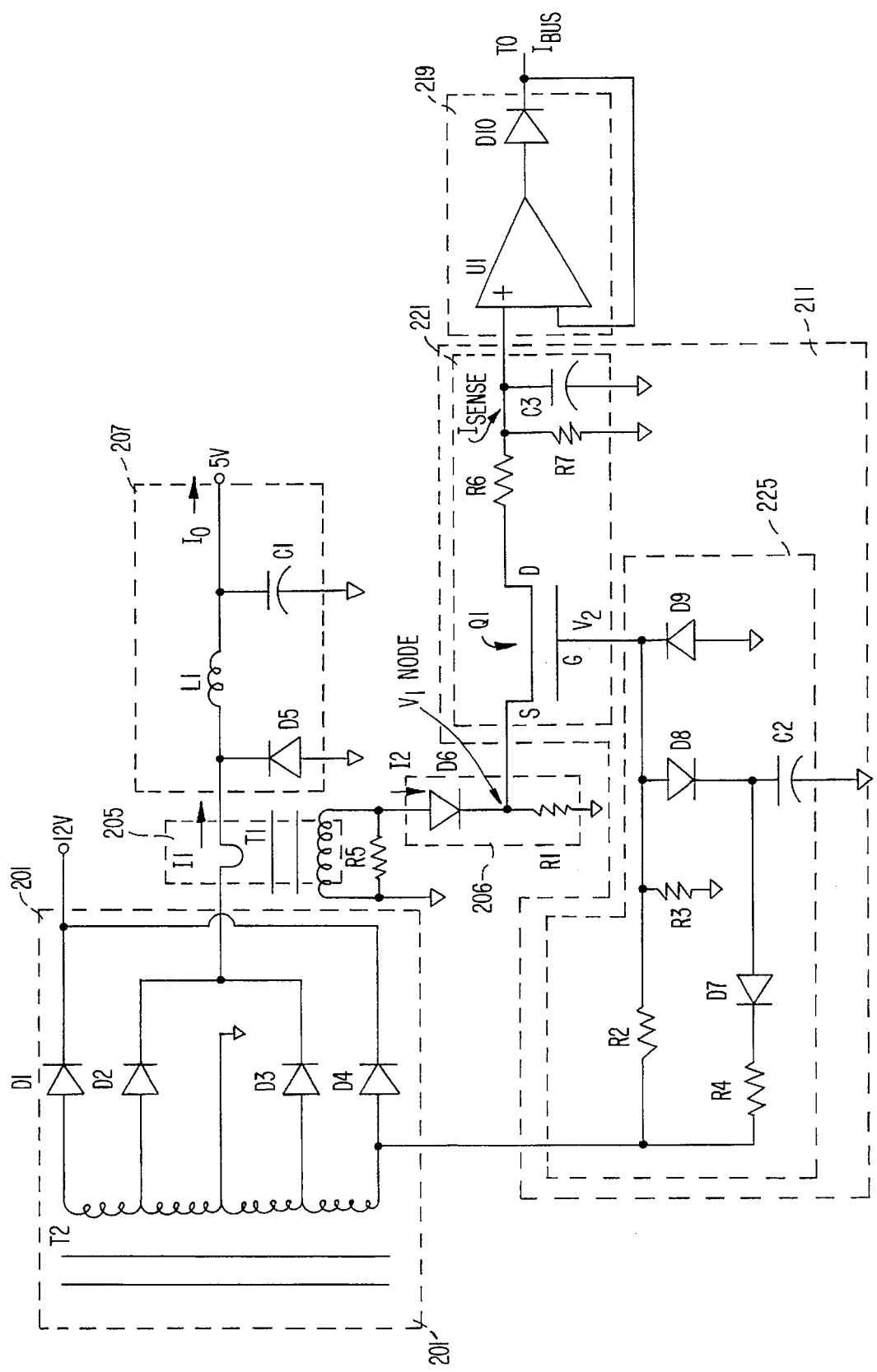
FIG. 7 illustrates a schematic diagram of the circuit elements employed in one embodiment of the present invention.

FIG. 7 illustrates in greater detail an embodiment of the present invention. T2 is the main power transformer in a switching power supply. T1 is a current sense transformer which has one turn on the primary side (the wire connecting the rectifying diodes D2 and D3 to the output filter consisting of L1 and C1. D2, D3, D5, L1, and C1 are the components normally found in a power supply. D5 is the catch diode, which clamps the voltage at the input of L1 when D2 and D3 are not conducting. The D2 and D3 configuration is shown for a push-pull power supply circuit, but different configurations of D2 and D3 are is equally suitable for other type of converters, such as Forward and Flyback converters.

With either D2 or D3 forward biased (conducting current), the peak current of I1 is equal to the +5V load current Io, plus some ripple current. The current out of the current sense transformer is I2, and is equal to I1/N, where N is the number of turns on the secondary of T1. I2 develops a voltage across R1. When I1 goes to zero, the magnetic field in T1 is reset by resistor R5 by the negative voltage across R5 so that the T1 does not saturate. Diode D6 isolates this negative voltage from R1 so that the transformer can be reset.

When D3 is conducting I1, a positive voltage at the anode of D4 is conducted through R2 to the gate (V2) of a field effect transistor (FET) Q1 to turn it on at the peak current reading of I1. For Q1 to turn on, it is important for the voltage on the gate to be approximately 5V or higher than the peak voltage of V1. Resistors (R2 and R3) form a voltage divider so that the gate-to-source voltage of Q1 does not exceed its rating. D8, R2, R3, and C2 form a delay network so that the turn-on of Q1 is delayed to prevent a turn-on transient of I2 from being applied to C3. R6 allows the peak of I2 to be smoothed so that the voltage stored on C3 represents the average peak current of I2. This voltage is $I_{sense}$, and is a DC voltage representation of Io. U1 and D10 buffer and isolate $I_{sense}$ so that this voltage may be coupled to a current sense bus for use with current shared power supplies, such as redundant power systems.

The resistor (R4) and diode (D7) provide a current path to discharge C2 quickly and to turn Q1 off at the end of the I1 conduction. Diode D9 clamps the gate voltage V2 close to ground. The peak current through the secondary transformer, as represented by V1, is stored on C3.

In one embodiment for the present invention, the sample and hold circuit includes a MOSFET transistor (e.g., a metal oxide semiconductor field effect transistor (MOSFET)). The MOSFET transistor includes having a first port coupled to a current sense transformer for receiving a voltage that is indicative of the current through the secondary transformer, a second port for providing an output voltage that is indicative of a direct current representation of the peak current in the secondary transformer, and a control port for receiving the control signal. The MOSFET transistor selectively couples the first port to the second port in response to the control signal generated by the peak detector circuit.

The sample and hold circuit further includes a storage capacitor that is coupled to the second port for storing the direct current voltage representation of the peak current through the secondary transformer. The direct current voltage representation of the peak current through the secondary transformer at the second port can be used for various purposes (e.g., current limiting or current sharing).

In an alternative embodiment, the second port may be coupled to a current sense bus via a buffering and isolation circuit. The current sense bus may be employed in current shared power supplies, such as redundant power systems.

Figure 8:
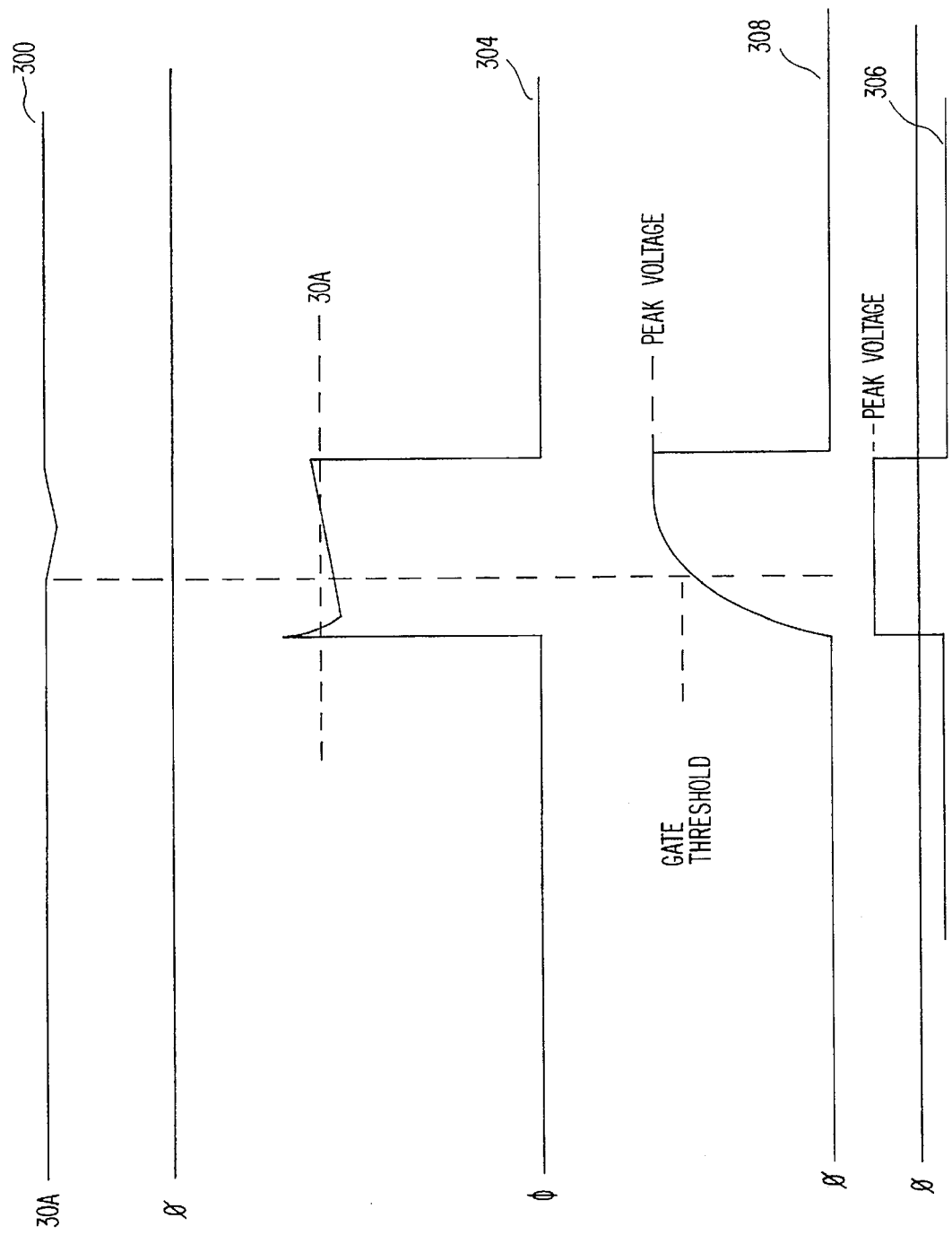
FIG. 8 illustrates the analog waveforms of particular nodes of FIG. 6.

FIG. 8 illustrates several analog waveforms at several nodes of FIG. 7. Please note that waveforms are not drawn to scale relative to each other. Waveform 300 is the output of the present invention (i.e., the current sense voltage). Waveform 300 represents a voltage representation of the current provided by this power supply voltage and is simply the voltage at the $I_{sense}$ node. Waveform 304 represents the voltage representation at node V1 of the input current I1.

The analog waveform 308 represents the voltage (V2) at the gate of transistor Q1. The voltage V2 turns Q1 on to allow the current I2 to charge the capacitor C3. When the power supply is turned off, Q1 is off. The resistor-capacitor circuit (R7 and C3) dissipates the voltage stored across C3, so that no voltage is passed to the $I_{Bus}$.

As is shown in FIG. 8, the current sense output of the present invention tracks the peak current V1 through the secondary transformer.

As is illustrated in FIG. 7, the resistor diode and capacitor network (R2, R3, R4, D7, D8, D9 and C2) are used in conjunction with the voltage at the anode of D4 to selectively enable and disable transistor Q1. The gate enabling signal is shown as 308 in FIG. 8.

Figure 9:
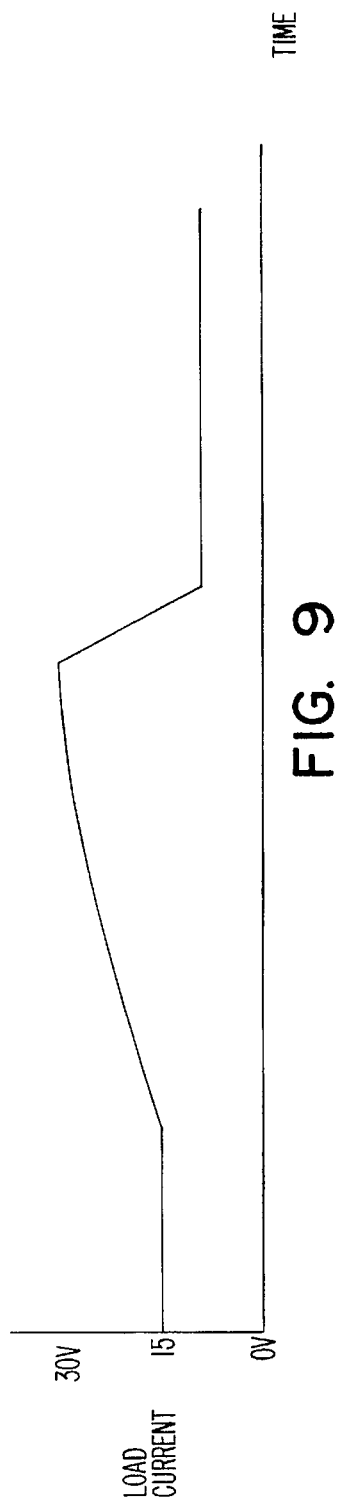
FIG. 9 illustrates the graph of the load current versus time.
Figure 10:
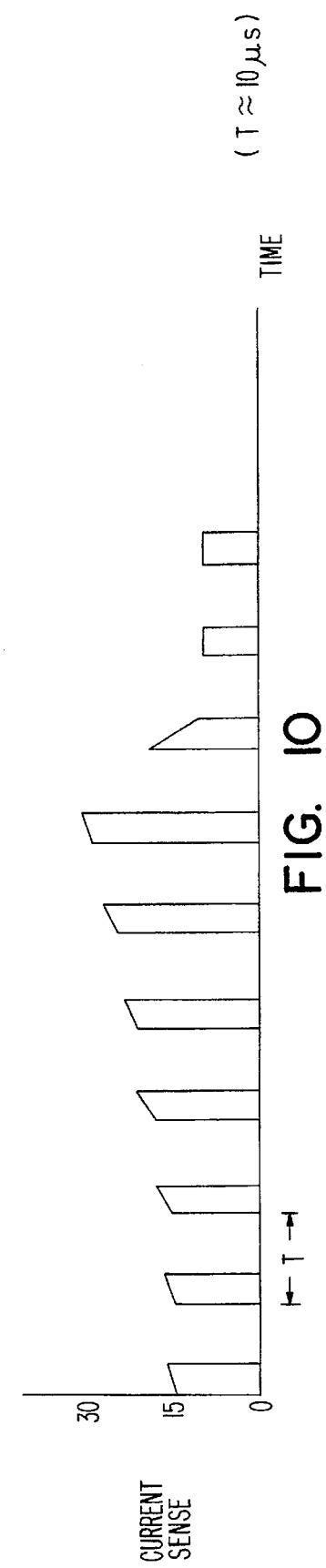
FIG. 10 illustrates the sense current versus time.
Figure 11:
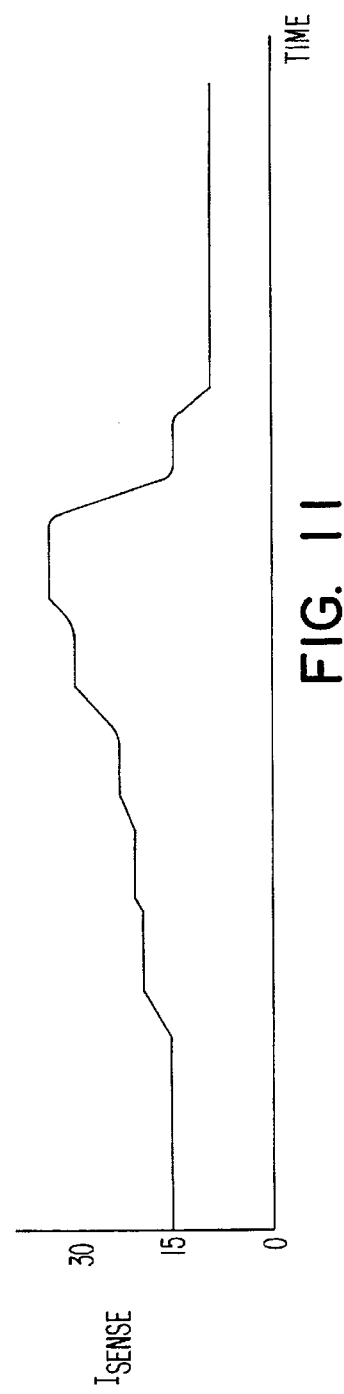
FIG. 11 illustrates current sense voltage versus time graph of the present invention.

FIG. 9 illustrates the graph of the load current versus time (i.e., at node Io). FIG. 10 illustrates the sense current versus time. FIG. 11 illustrates current sense voltage versus time graph of the present invention (i.e., the $I_{sense}$ node). In the load current versus time graph, it is noted that the current provided by the power supply voltage ramps up to a peak value of approximately 30 amperes and then falls to approximately 7 to 8 amperes.

The current sense versus time graph (FIG. 11) illustrates that $I_{sense}$ node, which is sampled every ten microseconds, approximates the load current versus time graph. The current sense voltage ($I_{sense}$ node) versus time graph also illustrates the voltage across C3 which is based upon the current sense voltage. Note that the $I_{sense}$ voltage ramps to the peak current during the sample period. Also, note that there is negligible voltage drop between the samples.

In sharp contrast, the prior art circuits generated a $I_{sense}$ versus time graph as illustrated in FIG. 12. For identical load current versus time and sense current versus time graphs, the prior art circuit exhibits a slow transient response, as well as, substantial ripple when compared to the present invention.

The present invention is a simple, low cost current sense circuit for switching power supplies that provides very fast transient response for both increases and decreases in current load. Moreover, the present invention provides a DC voltage that accurately represents the actual power supply output current with minimum ripple. This circuit may be employed in power supplies in current shared, redundant power systems for processors.

In the foregoing specification, the invention has been described with reference to specific exemplary embodiments thereof. It will however be evident that various modifications and changes may be made thereto without departing from the broader spirit and scope of the invention as set forth in the appended claims. The specification and drawings are accordingly to be regarded as illustrative rather than restrictive.

I claim:

1. A current sense circuit coupled to a secondary transformer of a power supply comprising:
   a. peak detection means coupled to the secondary transformer, for detecting a peak current pulse and generating a control signal;
   b. sample and hold means, coupled to the peak detection means and to a current sense transformer, for sampling the current through the secondary transformer under the direction of the detection means and providing a direct current voltage representation of the current through the secondary transformer.

2. The current sense circuit as claimed in claim 1 wherein the sample and hold means further includes:
   a first port for receiving a voltage, said voltage indicative of the current through the secondary transformer, a second port for providing an output voltage, said output voltage being a direct current voltage representation of the peak current pulse in the secondary transformer, and a control port for receiving the control signal, said sample and hold means selectively coupling the first port to the second port in response to the control signal.

3. The current sense circuit as claimed in claim 2 wherein the peak detection means further includes:
   a control circuit, coupled to the sampling means and the secondary transformer, for generating the control signal in response to the peak current pulse.

4. The current sense circuit as claimed in claim 3 wherein the sample and hold means further includes:
   means, coupled to the second port of the sample and hold means, for storing the direct current voltage representation of the peak current pulse.

5. A current sense circuit coupled to a secondary transformer of a power supply comprising:
   a. a peak detector, coupled to the secondary transformer, said peak detector detecting a peak current pulse through said secondary transformer and generating a control signal;
   b. a sample and hold unit, coupled to the peak detector and to a current sense transformer, said sample and hold unit sampling the current through the secondary transformer under the direction of the peak detector and providing a direct current voltage representation of the current through the secondary transformer.

6. The current sense circuit as claimed in claim 5 wherein the sample and hold unit further includes
   a. a first port for receiving a voltage, said voltage indicative of the current through the secondary transformer;
   b. a second port for providing an output voltage, said output voltage being a direct current voltage representation of the current through the secondary transformer; and
   c. a control port for receiving the control signal, said sample and hold unit selectively coupling the first port to the second port in response to the control signal.

7. The current sense circuit as claimed in claim 5 wherein the peak detector further includes a control circuit, coupled to the secondary transformer, said control circuit generating the control signal in response to the peak current pulse.

8. The current sense circuit as claimed in claim 5 wherein the sample and hold unit further includes
   a capacitor for storing the direct current voltage representation of the current through the secondary transformer.

9. The current sense circuit as claimed in claim 6 wherein the sample and hold unit further includes
   a field effect transistor, said field effect transistor having the first port and the control port.

10. The current sense circuit as claimed in claim 9 wherein the field effect transistor is a metal oxide semiconductor.

11. A power supply system comprising
   a. a power supply transformer secondary output circuit having a current passing through the secondary transformer;
   b. a current sense transformer, coupled to the power supply transformer secondary output circuit, said current sense transformer generating a current, said current indicative of the current through the secondary transformer;
   c. a current-to-voltage conversion circuit, coupled to the current sense transformer, for converting the current provided by the current sense transformer into a voltage, said voltage representing the current through the secondary transformer; and
   d. a peak detection sample and hold circuit, coupled to the power supply transformer secondary output circuit and the current-to-voltage conversion circuit, said peak detection sample and hold circuit selectively providing the voltage generated by the current two voltage conversion circuit at an output node in response to a peak current received from the power supply transformer secondary output circuit.

12. The power supply system as claimed in claim 11 wherein the power supply further comprises an isolation circuit, coupled to the peak detection sample and hold circuit, said isolation circuit isolating the output of the peak detection sample and hold circuit from a current sense bus.

13. The power supply system as claimed in claim 11 wherein the peak detection sample and hold circuit further comprises
   a. a peak detector, coupled to the power supply transformer secondary output circuit, said peak detector for generating a control signal in response to a peak current from the power supply transformer secondary output circuit; and b. a sample and hold unit, coupled to the current voltage conversion circuit and the peak detector, for selectively providing the output of the current voltage conversion circuit to an output port of the sample and hold unit under the direction of the control signal.

14. The power supply system as claimed in claim 11 wherein the sample and hold unit further includes a capacitor for storing a voltage, said voltage representing the current through the secondary transformer.

15. The power supply system as claimed in claim 11 wherein the sample and hold unit further includes a. a first port for receiving a voltage, said voltage indicative of the current through the secondary transformer;

b. a second port for providing an output voltage, said output voltage being a direct current voltage representation of the current through the secondary transformer; and c. a control port for receiving the control signal, said sample and hold unit selectively coupling the first port to the second port in response to the control signal.

16. The power supply system as claimed in claim 11 wherein the peak detector further includes a control circuit, coupled to the secondary transformer, said control circuit generating the control signal in response to the peak current pulse.

17. The power supply system as claimed in claim 11 wherein the sample and hold unit further includes a field effect transistor, said field effect transistor having the first port and the control port.

18. The power supply system as claimed in claim 11 wherein the field effect transistor is a metal oxide semiconductor.

* * * * *